(12) United States Patent
McCluskey et al.

(10) Patent No.: US 9,099,426 B2
(45) Date of Patent: Aug. 4, 2015

(54) TRENCH-ASSISTED THERMOELECTRIC ISOTHERMALIZATION OF POWER SWITCHING CHIPS

(75) Inventors: F. Patrick McCluskey, Ellicott City, MD (US); Avram Bar-Cohen, Bethesda, MD (US); Peng Wang, Laurel, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 444 days.

(21) Appl. No.: 13/403,307

(22) Filed: Feb. 23, 2012

(65) Prior Publication Data

US 2012/0293962 A1    Nov. 22, 2012

Related U.S. Application Data

(60) Provisional application No. 61/445,696, filed on Feb. 23, 2011.

(51) Int. Cl.
*H05K 7/20* (2006.01)
*H01L 23/38* (2006.01)
*G06F 1/20* (2006.01)
*H01L 23/34* (2006.01)

(52) U.S. Cl.
CPC ...... *H01L 23/38* (2013.01); *G06F 1/20* (2013.01); *H01L 23/34* (2013.01); *H05K 7/209* (2013.01); *H05K 7/20254* (2013.01); *H01L 2924/0002* (2013.01); *Y10T 29/49826* (2015.01)

(58) Field of Classification Search
CPC ...... H05K 7/209; H05K 7/20254; G06F 1/20; H01L 23/34; H01L 23/38; H01L 2924/0002; H01L 2924/00; Y10T 29/49826
USPC .............. 361/715, 717, 718, 699, 710
See application file for complete search history.

(56) References Cited

U.S. PATENT DOCUMENTS

| | | | | |
|---|---|---|---|---|
| 4,894,709 | A * | 1/1990 | Phillips et al. | 257/714 |
| 5,448,109 | A * | 9/1995 | Cauchy | 257/719 |
| 5,714,791 | A * | 2/1998 | Chi et al. | 257/467 |
| 6,432,809 | B1 * | 8/2002 | Tonti et al. | 438/618 |
| 6,570,247 | B1 * | 5/2003 | Eiles et al. | 257/707 |
| 6,686,532 | B1 * | 2/2004 | Macris | 136/204 |
| 6,743,972 | B2 * | 6/2004 | Macris | 136/201 |
| 6,942,018 | B2 * | 9/2005 | Goodson et al. | 165/80.4 |
| 7,290,596 | B2 * | 11/2007 | Yang et al. | 165/146 |
| 7,654,311 | B2 * | 2/2010 | Yang et al. | 165/185 |
| 2002/0134419 | A1 * | 9/2002 | Macris | 136/204 |
| 2003/0017650 | A1 * | 1/2003 | Armbrust et al. | 438/122 |
| 2003/0035269 | A1 * | 2/2003 | Chiu | 361/704 |
| 2004/0118129 | A1 * | 6/2004 | Chrysler et al. | 62/3.2 |
| 2005/0068737 | A1 * | 3/2005 | Leija et al. | 361/704 |
| 2006/0260793 | A1 * | 11/2006 | Yang et al. | 165/185 |

* cited by examiner

*Primary Examiner* — Anatoly Vortman
(74) *Attorney, Agent, or Firm* — Squire Patton Boggs (US) LLP

(57) ABSTRACT

One embodiment includes a power module. The power module includes a power switching device, at least one spot cooler and a base cooler. The at least one spot cooler and base cooler are configured to lower an average surface junction temperature and to isothermalize the surface junction temperature of the power switching device. The at least one spot cooler is embedded in at least one of a heat sink base or base cooler of the power module, and the at least one of the heat sink base or base cooler are attached onto a double side metalized substrate that is attached to the power switching device. In one embodiment, the power module further includes a trench structure cut into the double side metalized substrate.

11 Claims, 7 Drawing Sheets

TRENCH-ASSISTED THERMOELECTRIC ISOTHERMALIZATION OF POWER SWITCHING CHIPS

CROSS REFERENCE TO RELATED APPLICATIONS

This application claims the benefit of U.S. Provisional Application No. 61/445,696 filed on Feb. 23, 2011. The entire contents of this earlier filed application are hereby incorporated by reference.

BACKGROUND

1. Field

Embodiments of the invention relate to power devices, such as power switching devices or chips.

2. Description of the Related Art

Power devices are semiconductor devices that can be used as switches or rectifiers in power electronic circuits. Examples of power devices include the power diode, thyristor, power metal oxide semiconductor field-effect transistor (MOSFET), bipolar junction transistor (BJT), and insulated gate bipolar transistor (IGBT).

Power devices may be divided into those that are two terminal devices and those that are three terminal devices. The state of two terminal devices, such as diodes, is completely dependent upon the external power circuit they are connected to. The state of three terminal devices, such as a transistor or thyristor, is not only dependent upon their external power circuit, but also upon the signal on their driving terminal (i.e., gate or base).

In addition, power devices can be majority carrier devices (e.g., MOSFET) or minority carrier devices (e.g., BJT). Majority carrier devices use only one type of charge carriers, while minority carrier devices use both types of charge carriers, i.e., electrons and holes. Majority carrier devices may be faster, but the charge injection of minority carrier devices allows for better on-state performance.

IGBTs have replaced the bipolar transistor in power applications, and the use of power modules where several IGBT dice are connected in parallel is applicable for power levels of several megawatts. IGBT has the advantage of being a minority carrier device with good on-state performance, and simultaneously having the high input impedance of a MOSFET so that it can be driven on and off with a low amount of power.

Thermal resistance is an important parameter for power devices. Semiconductors do not perform well at high temperatures, but, because of large current conduction, power semiconductor devices will heat up. Accordingly, power semiconductor devices need to be cooled by the continuous removal of heat. Packaging and heat sinks provide a way to remove heat from power semiconductor devices by conducting the heat to the external environment. As a result, large power devices also have large die and packaging surface areas and lower thermal resistance.

SUMMARY

One embodiment is directed to a power module. The power module includes a power switching device, at least one spot cooler and a base cooler. The at least one spot cooler and base cooler are configured to lower an average surface junction temperature and to isothermalize the surface junction temperature of the power switching device. The at least one spot cooler is embedded in at least one of a heat sink base or base cooler of the power module, and the at least one of the heat sink base or base cooler are attached onto a double side metalized substrate that is attached to the power switching device.

Another embodiment is directed to a method for forming, assembling or manufacturing a power module. The method includes embedding at least one spot cooler in at least one of a heat sink base or base cooler of a power switching device. The spot cooler is configured to lower an average surface junction temperature and isothermalize the surface junction temperature of the power switching device. The method further includes attaching the at least one of the heat sink base or base cooler onto a double side metalized substrate that is attached to the power switching device, and cutting a trench structure into the double side metalized substrate.

Another embodiment is directed to a power module. The power module includes cooling means for lowering an average surface junction temperature and isothermalizing the surface junction temperature of a power switching device. The cooling means is embedded in at least one of a heat sink base or base cooler of the power module. The power module further includes blocking means for blocking effects of three dimensional heat spreading in the double side metalized substrate and to redirect and concentrate thermoelectric cooling power directly to the power switching device.

BRIEF DESCRIPTION OF THE DRAWINGS

For proper understanding of the invention, reference should be made to the accompanying drawings, wherein.

DETAILED DESCRIPTION

Figure 1A:
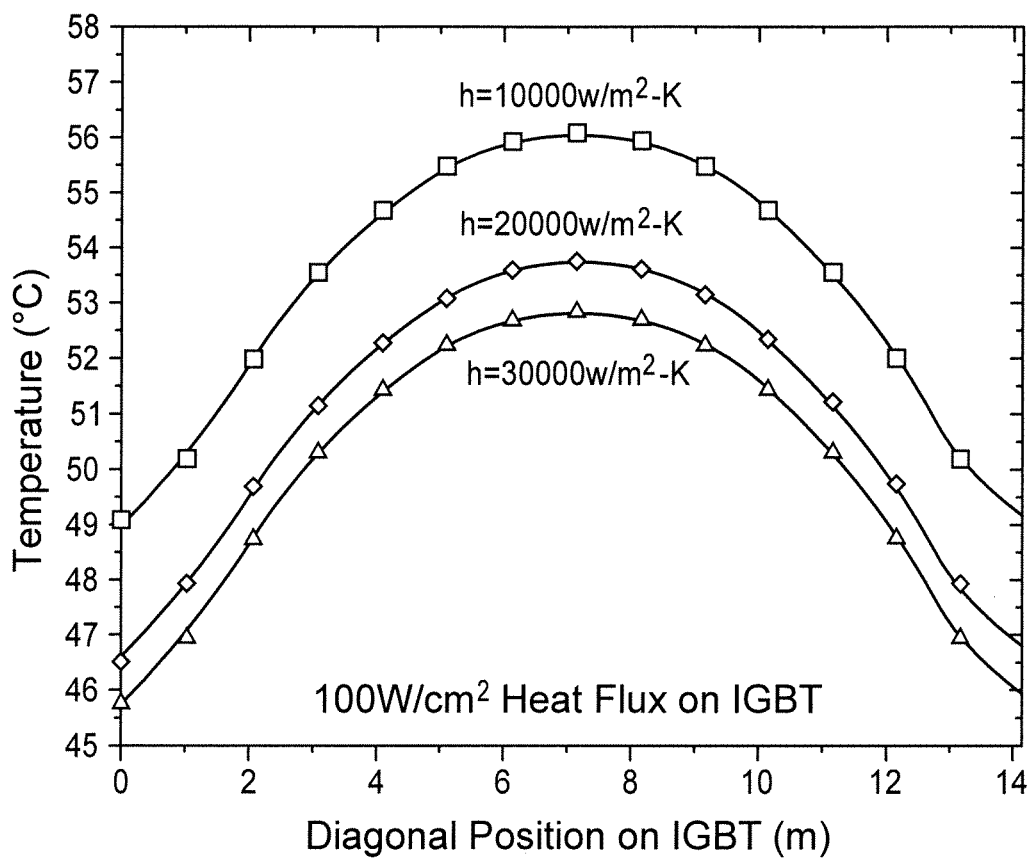
FIG. 1a illustrates a graph showing temperature distribution, according to an embodiment.

It will be readily understood that the components of the invention, as generally described and illustrated in the figures herein, may be arranged and designed in a wide variety of different configurations. Thus, the following detailed description of the embodiments of a system, device, and/or method, as represented in the attached figures, is not intended to limit the scope of the invention as claimed, but is merely representative of selected embodiments of the invention.

Trends in power electronics over the last decade have placed increasing demands on the thermal management systems used for power electronic modules, such as IGBT modules. The demand to decrease the size of power electronics systems has resulted in a 50% footprint area reduction of some power electronic modules, while accommodating higher heat flux on the chip (e.g., an IGBT chip).

For example, the heat flux of power electronics chips for hybrid electric vehicles is now at the level of 100 to 200 W/cm$^2$ and will increase up to 500 W/cm$^2$ in the upcoming years, especially with the advent of smaller, higher power, SiC devices. Processing high levels of heat dissipation results in high average temperatures and a non-uniform temperature distribution on the top surface of semiconductor switching devices, such as IGBTs. These high temperatures and temperature non-uniformities significantly affect the performance and reliability of the switching devices.

These switching devices may be packaged in a module in which the backside of the chip is electrically, mechanically, and thermally connected to a high thermal conductivity substrate. This substrate can be one of any of a number of double side metalized ceramic plates, the most common of which are direct bond copper (on alumina or aluminum nitride ceramic), reactive braze metalized silicon nitride, and direct bond aluminum (on alumina or aluminum nitride ceramic). This substrate permits interconnection of the backside of the devices while providing electrical isolation and thermal conductivity. The substrate may lie above and be thermally connected to a heat sink or spreader. The devices are interconnected on the top surface by wirebonds or other interconnect technology. As mentioned above, higher heat fluxes lead to higher and less uniform chip temperature, thereby degrading the device performance and system reliability significantly. Therefore, isothermalizing the chip and maintaining the maximum temperature below a specified limit have become critical issues for thermal management of power electronics. Embodiments of the invention make it possible to achieve at least these goals.

Certain embodiments of the invention relate to the combination/embedding of a thin-film thermoelectric device in a microchannel heat sink or other heat sink or spreader to reduce the average chip temperature of power switching devices, such as IGBTs, and to isothermalize the chip surface temperature. One embodiment enhances isothermalization by the use of a trench structure in the double side metalized ceramic substrate, which may lie between the microchannel heat sink/thermoelectric cooler and the chip (i.e., switching device).

Figure 1B:
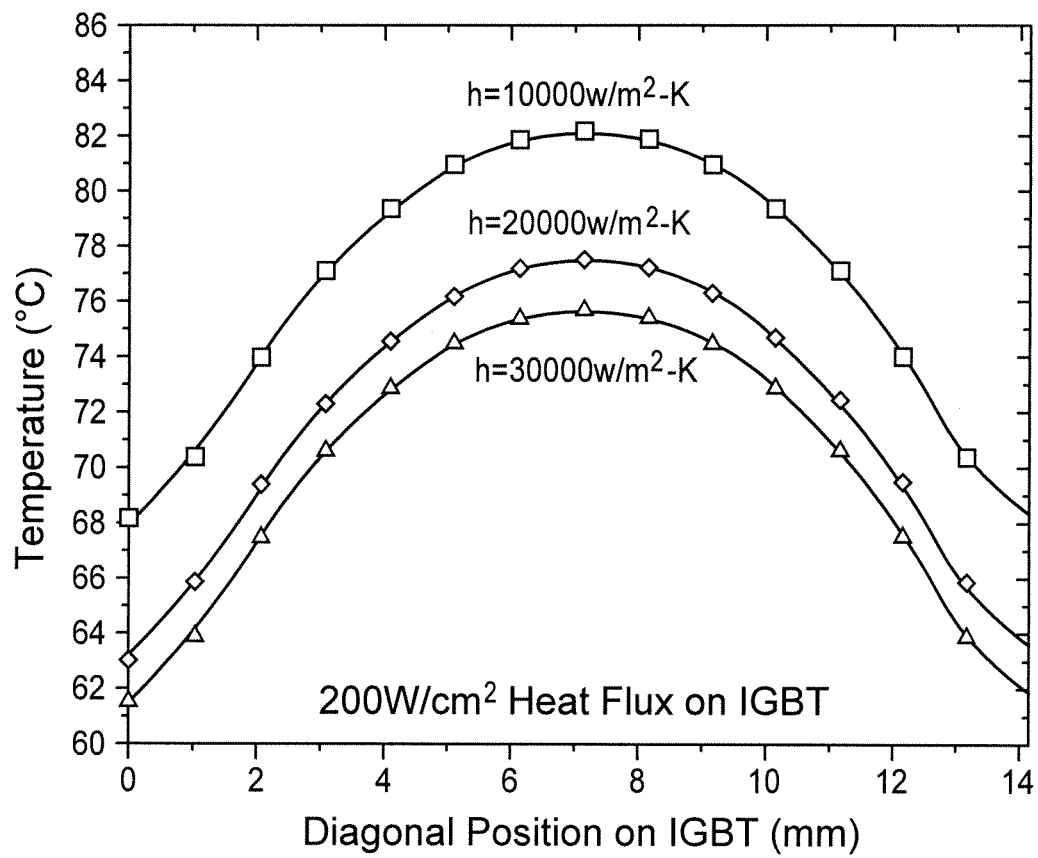
FIG. 1b illustrates a graph showing temperature distribution, according to another embodiment.

The application of high heat transfer coefficient, single-phase or two-phase cooling solutions, as can be achieved with microchannel coolers, and especially manifold microchannel coolers, can limit the peak temperature of a high flux IGBT chip, but result in highly non-uniform temperature distributions on the chip. For example, FIG. 1a illustrates a graph showing the temperature distribution with respect to diagonal position on the chip for a heat flux of 100 W/cm$^2$. FIG. 1b illustrates a graph showing the temperature distribution with respect to diagonal position on the chip for a heat flux of 200 W/cm$^2$. Such non-uniform temperature distributions on the IGBT chip cannot be eliminated by traditional electronic cooling technologies and, more importantly, are independent of the cooling capability of microchannel coolers. Consequently, there is an urgent need for new cooling solutions, which can isothermalize the IGBT chips in use in a wide range of applications including those in the automotive, wind power, and energy conversion industries, for example.

Embodiments of the invention are directed to the combination of a spot cooler with a base cooler to lower both the average surface junction temperature and to isothermalize the surface junction temperature of power electronic switching devices, including but not limited to IGBTs. In an embodiment, the spot cooler may be a thermoelectric cooler, for example. The base cooler, according to certain embodiments, may be a microchannel or manifold microchannel cooler, for example. Solid-state thermoelectric coolers are an ideal candidate for isothermalization because they are highly reliable, can be locally attached to the chip or substrate, and can be integrated with integrated circuit (IC) processing.

Figure 2:
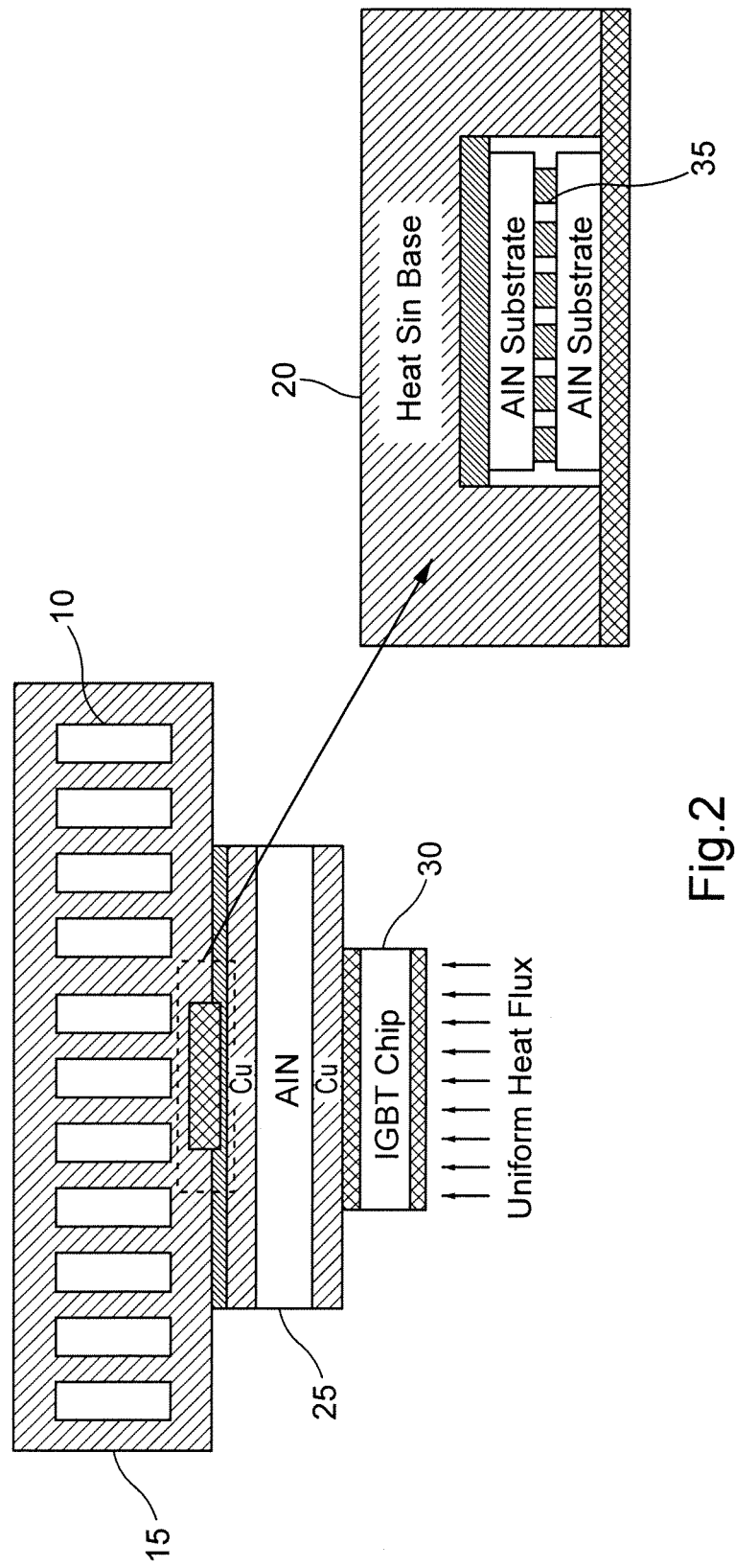
FIG. 2 illustrates a diagram of a power module with thermoelectric cooling of a power switching device, according to one embodiment.

FIG. 2 illustrates an example of a power module, according to one embodiment. In an embodiment, the power module may include an IGBT chip 30, double side metalized ceramic substrate 25, heat sink base 20, and microchannels 10 in the heat sink 15. In one embodiment, the double side metalized ceramic substrate 25 may be direct bond copper (DBC). However, the double side metalized ceramic substrate 25 can be any number of double side metalized ceramic plates, as discussed above.

As illustrated in FIG. 2, an array of thermoelectric coolers 35 can be embedded in the heat sink base 20 and attached onto the double side metalized ceramic substrate 25. The use of an array of thermoelectric coolers (TECs) 35, as shown in FIG. 2, is found to yield improvements in the uniformity of the IGBT temperature profile at the center of the chip 30.

Figure 3:
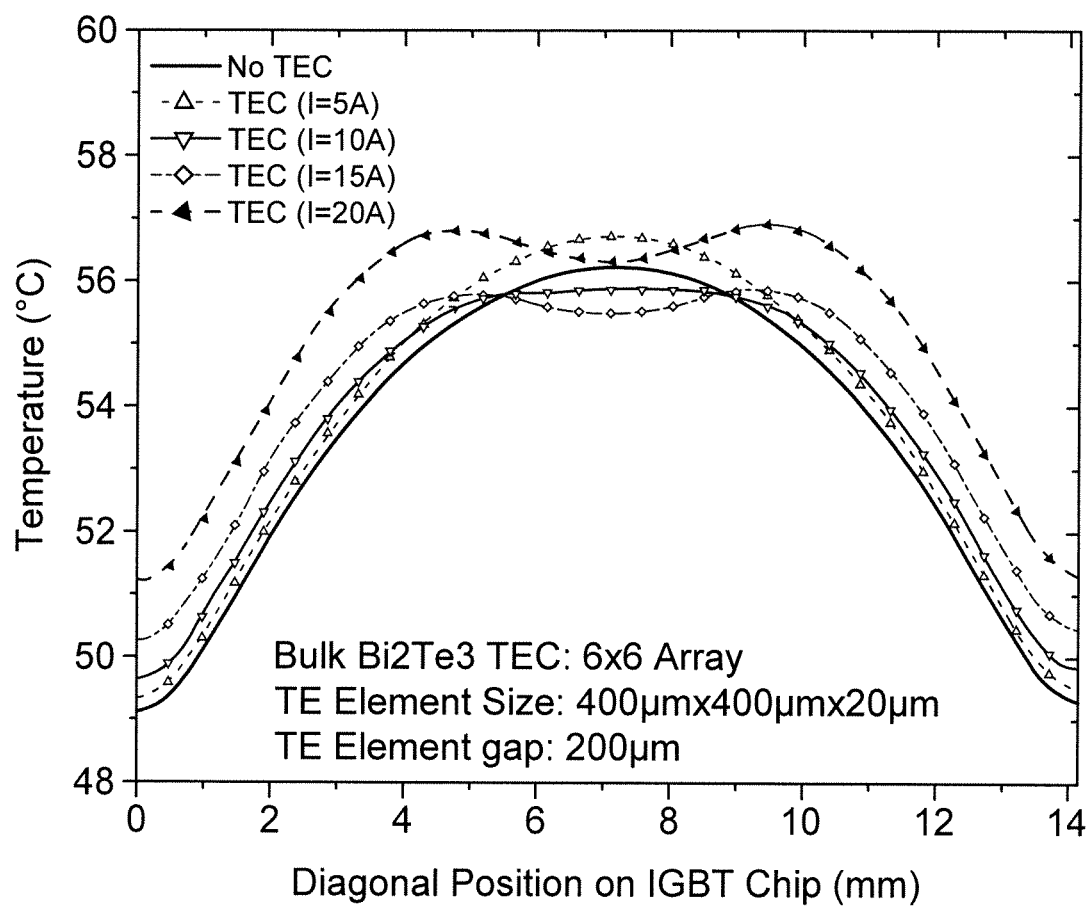
FIG. 3 illustrates a graph showing results of power switching device cooling using bulk TEC, according an embodiment.

FIG. 3 illustrates a graph showing the improvements in temperature profile uniformity, where the temperature profile for no TEC cooling and for a TEC attached to the DBC without a trench are displayed on the graph. In particular, FIG. 3 shows simulation results of IGBT chip cooling using bulk TEC (6×6 20 μm-thick $Bi_2Te_3$ element array) without a trench structure in the DBC 25.

Figure 4:
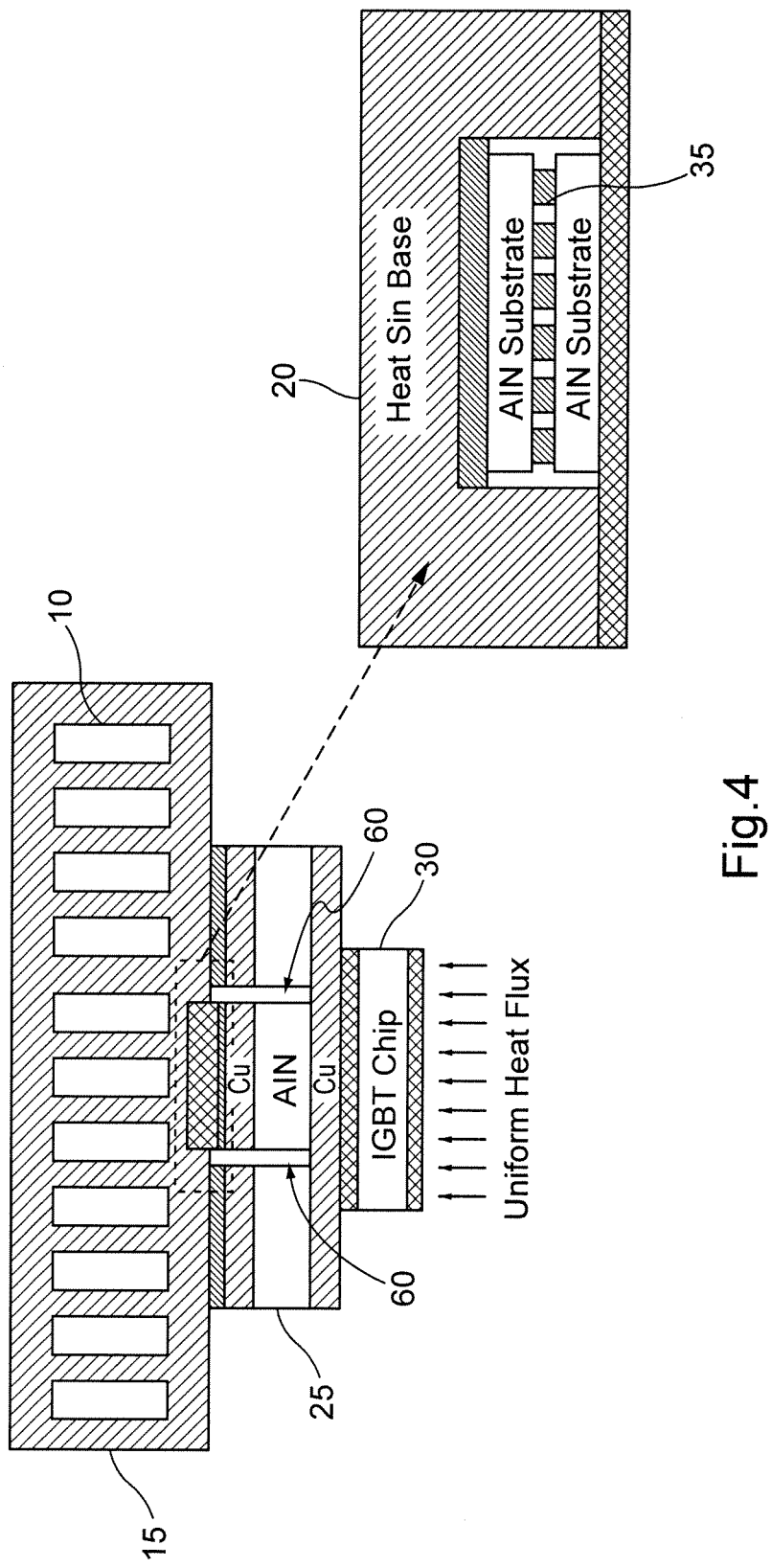
FIG. 4 illustrates a diagram of a power module with thermoelectric cooling of a power switching device, according to another embodiment.

In another embodiment, the thermoelectric isothermalization of the chip 30 can be enhanced by the use of trench structure in the double side metalized substrate 25. According to this embodiment, a trench structure 60 is cut into the double side metalized substrate 25, such as DBC. The trench structure 60 serves to block the effects of three-dimensional heat spreading in the substrate 25 and to redirect and concentrate the thermoelectric cooling power directly to the IGBT chip 30. FIG. 4 illustrates an example design or configuration for the thermoelectric cooling of IGBT chip 30 enhanced with a trench structure 60 in the substrate 25.

Figure 5A:
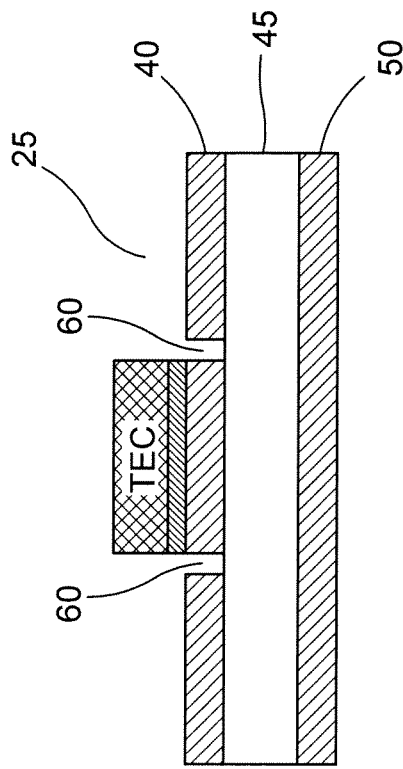
FIG. 5a illustrates an example of a double side metalized substrate, according to one embodiment.

FIG. 5a illustrates the double sided metalized substrate 25 without the inclusion of a trench structure 60. As shown in FIG. 5a, the substrate 25, such as DBC, can include a top metalization layer 40, such as copper, a middle ceramic layer 45, such as AlN, and a bottom metallization layer 50, such as copper.

Figure 5B:
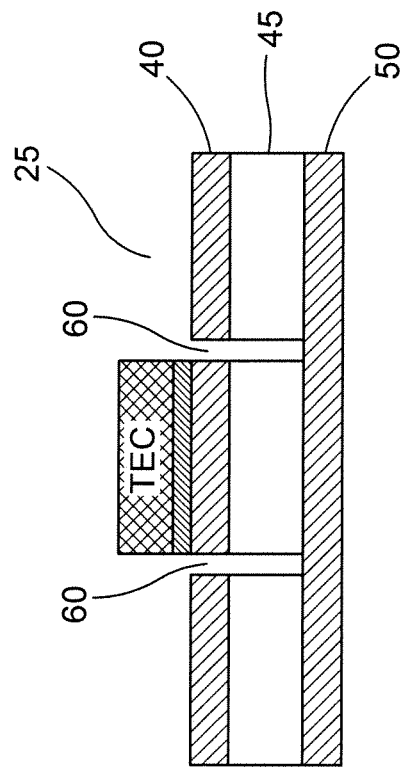
FIG. 5b illustrates an example of a double side metalized substrate, according to another embodiment.
Figure 5C:
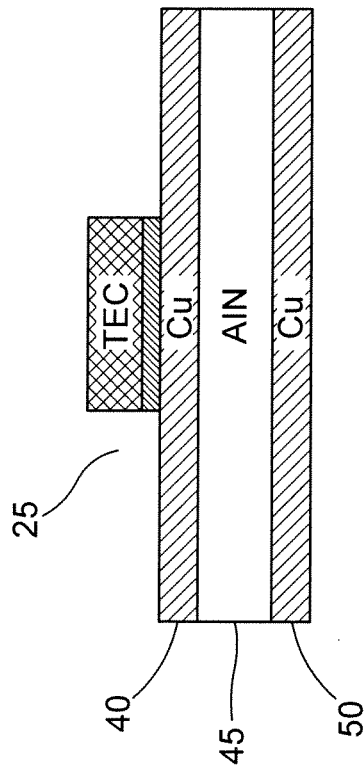
FIG. 5c illustrates an example of a double side metalized substrate, according to an embodiment.
Figure 5D:
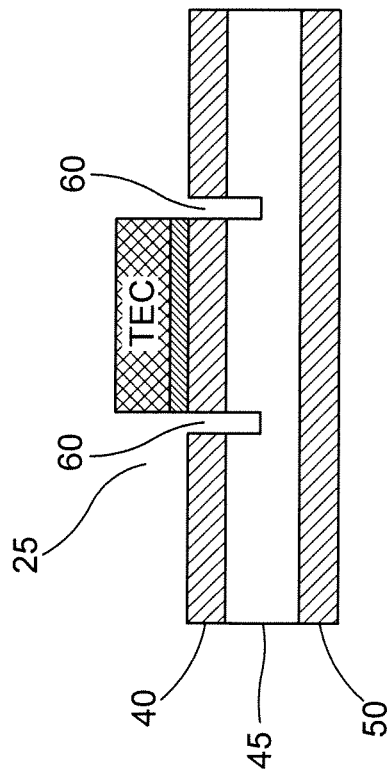
FIG. 5d illustrates an example of a double side metalized substrate, according to an embodiment.

As illustrated in FIGS. 5b-5d, several different implementations are possible for cutting the trench structure 60 into the substrate 25. For example, as illustrated in FIG. 5b, the trench structure 60 may be cut only through the top metallization layer 40 of the substrate 25. FIG. 5c illustrates an example where the trench structure 60 may be cut to the middle of the ceramic layer 45 of the substrate 25. FIG. 5d illustrates an example where the trench structure 60 may be cut to the bottom metallization layer 50 of the substrate 25.

Figure 6:
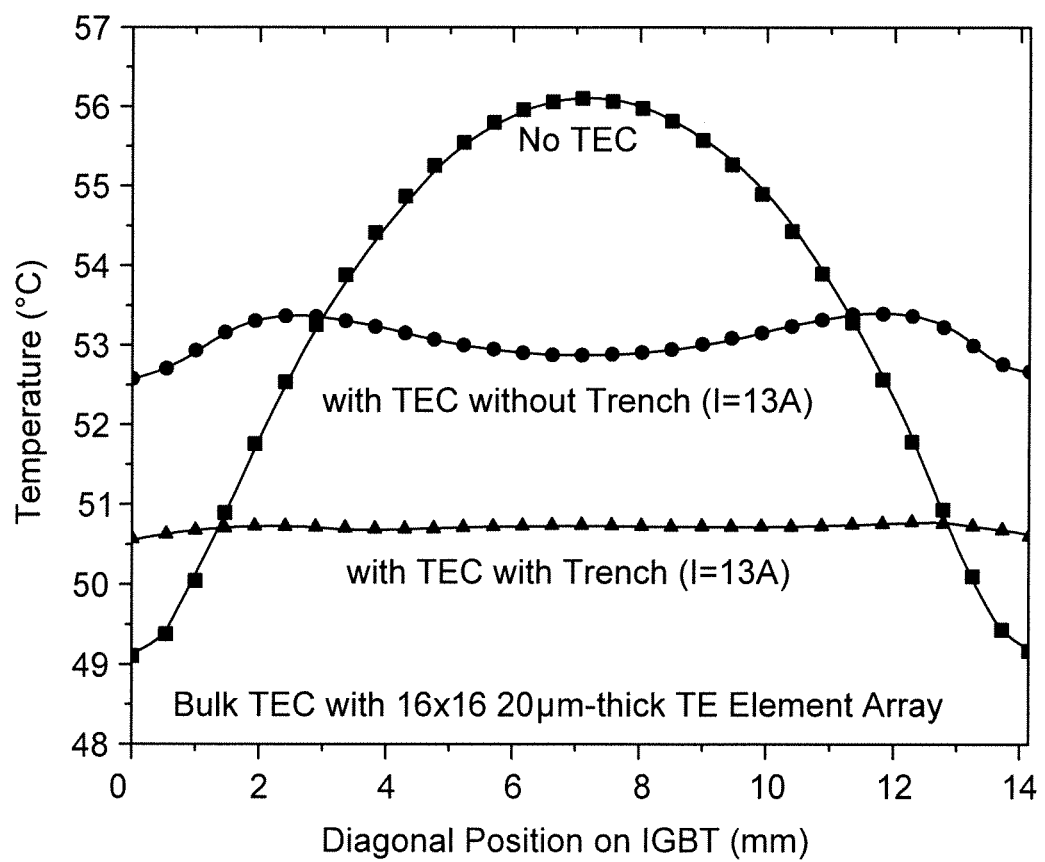
FIG. 6 illustrates a graph showing results of power switching device cooling using bulk TEC enhanced with a trench structure, according an embodiment.

FIG. 6 illustrates a graph showing the results of numerical simulation, which serve to verify the isothermalization capability of the trench-assisted thermoelectric cooling technique provided by embodiments of the invention. In particular, FIG. 6 shows that, when a 16×16 TEC is embedded into the copper microchannel base and enhanced with a trench 60 in the DBC substrate 25 with a configuration as shown in FIG. 5d, not only does the average IGBT chip temperature decrease to 47.2° C., corresponding to 6.1° C. global cooling, but also the maximum temperature gradient on the whole chip is suppressed to 0.4° C. Therefore, the cooling solution provided by the embodiments described herein can successfully lead to both isothermalization and minimization of the IGBT surface temperature. Such an improvement will be very beneficial to the thermal management of power electronics and other devices.

If desired, the different functions discussed above may be performed in a different order and/or concurrently with each other. Furthermore, if desired, one or more of the above-described functions may be optional or may be combined. As such, the foregoing description should be considered as merely illustrative of the principles, teachings and embodiments of this invention, and not in limitation thereof.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A power module, comprising:
   a power switching device;
   a double sided metalized substrate;
   at least one spot cooler;
   a base cooler comprising a heat sink base,
   wherein the at least one spot cooler and the base cooler are configured to lower an average surface junction temperature and to isothermalize the surface junction temperature of the power switching device,
   wherein the at least one spot cooler is embedded in at least one of the heat sink base or the base cooler of the power module, and
   wherein the at least one of the heat sink base or the base cooler are attached onto the double side metalized substrate that is attached to the power switching device; and
   a trench structure cut into the double side metallized substrate, the trench structure configured to block effects of three dimensional heat spreading in the substrate and to redirect and concentrate thermoelectric cooling power directly to the power switching device, wherein the trench structure is cut through a top metallization layer of the substrate.

2. The power module according to claim 1, wherein the trench structure extends to a middle of a center ceramic layer of the substrate.

3. The power module according to claim 1, wherein the trench structure extends through the entire ceramic layer to the bottom metallization layer of the substrate.

4. The power module according to claim 1, wherein the power switching device comprises an insulated gate bipolar transistor (IGBT) chip.

5. The power module according to claim 1, wherein the spot cooler comprises a thermoelectric cooler.

6. The power module according to claim 1, wherein the base cooler comprises a microchannel cooler or a manifold microchannel cooler.

7. A power module, comprising:
   cooling means for lowering an average surface junction temperature and isothermalizing the surface junction temperature of a power switching device, wherein the cooling means is embedded in at least one of a heat sink base or base cooler of the power module;
   a double sided metalized substrate attached to the power switching device; and
   blocking means for blocking effects of three dimensional heat spreading in the double sided metalized substrate and to redirect and concentrate thermoelectric cooling power from the cooling means directly to the power switching device, wherein the blocking means is provided through a top metallization layer of the substrate.

8. The power module according to claim 7, wherein the blocking means extends to a middle of a center ceramic layer of the substrate.

9. The power module according to claim 7, wherein the blocking means extends through the entire ceramic layer to the bottom metallization layer of the substrate.

10. The power module according to claim 7, wherein the cooling means comprises a thermoelectric cooler.

11. The power module according to claim 7, the power switching device comprises an insulated gate bipolar transistor (IGBT) chip.

* * * * *